US012628621B2

(12) United States Patent
Yang et al.

(10) Patent No.: US 12,628,621 B2
(45) Date of Patent: May 12, 2026

(54) SEMICONDUCTOR STRUCTURE AND METHOD OF OVERLAY MEASUREMENT OF SEMICONDUCTOR STRUCTURE

(71) Applicant: NANYA TECHNOLOGY CORPORATION, New Taipei City (TW)

(72) Inventors: Chan Hen Yang, Taipei City (TW); Yun Chen Wu, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 449 days.

(21) Appl. No.: 18/165,321

(22) Filed: Feb. 6, 2023

(65) Prior Publication Data

US 2024/0266234 A1     Aug. 8, 2024

(51) Int. Cl.
  H10P 74/00      (2026.01)
  H10P 74/20      (2026.01)
  H10W 46/00      (2026.01)

(52) U.S. Cl.
  CPC ............ H10P 74/27 (2026.01); H10P 74/203 (2026.01); H10W 46/00 (2026.01)

(58) Field of Classification Search
  CPC ....... H01L 22/30; H01L 22/12; H01L 23/544;
  H01L 2223/54426; H01L 22/20; G03F 7/70633; G03F 7/70683; G03F 7/70605–706851; G01B 11/02
  See application file for complete search history.

(56) References Cited

U.S. PATENT DOCUMENTS

| | | | |
|---|---|---|---|
| 2018/0157784 A1* | 6/2018 | Levinski | G03F 7/70683 |
| 2021/0116389 A1* | 4/2021 | Feng | G01N 21/9501 |
| 2021/0240089 A1* | 8/2021 | Golotsvan | G03F 7/70683 |
| 2024/0004310 A1* | 1/2024 | Blanton | G03F 7/70633 |

* cited by examiner

*Primary Examiner* — Moazzam Hossain
(74) *Attorney, Agent, or Firm* — CKC & Partners Co., LLC

(57)     ABSTRACT

A method of overlay measurement of a semiconductor structure includes a number of operations. A semiconductor structure with a pre-layer and a current layer over the pre-layer is provided, wherein the pre-layer includes a first overlay mark with a first grating group and a second grating group, and the current layer includes a second overlay mark. A semiconductor process is performed on the semiconductor structure. A detection beam is irradiated to the first overlay mark. A first intensity distribution of the first grating group and a second intensity distribution of the second grating group with respect to the reference point of the first overlay mark are received.

9 Claims, 10 Drawing Sheets

MS1

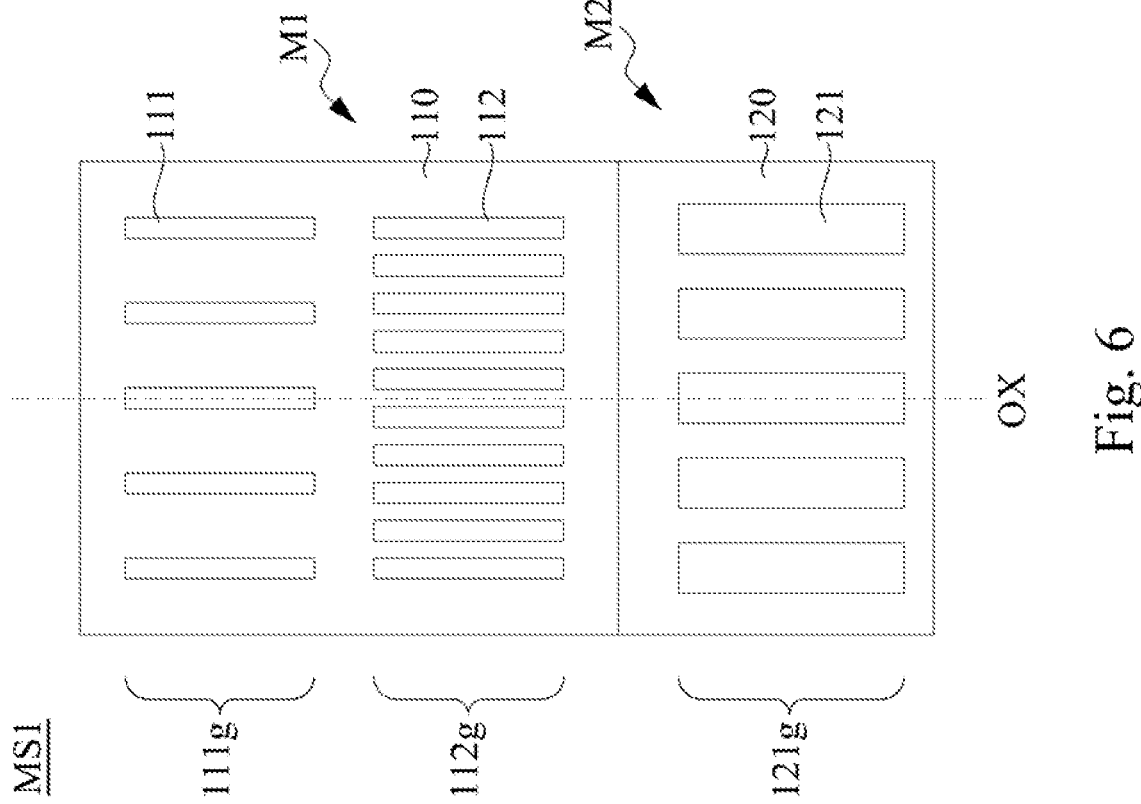
MS1
111
M1
110
112
M2
120
121
111g
112g
121g
OX
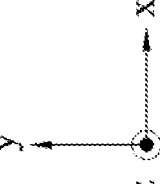
Fig. 6

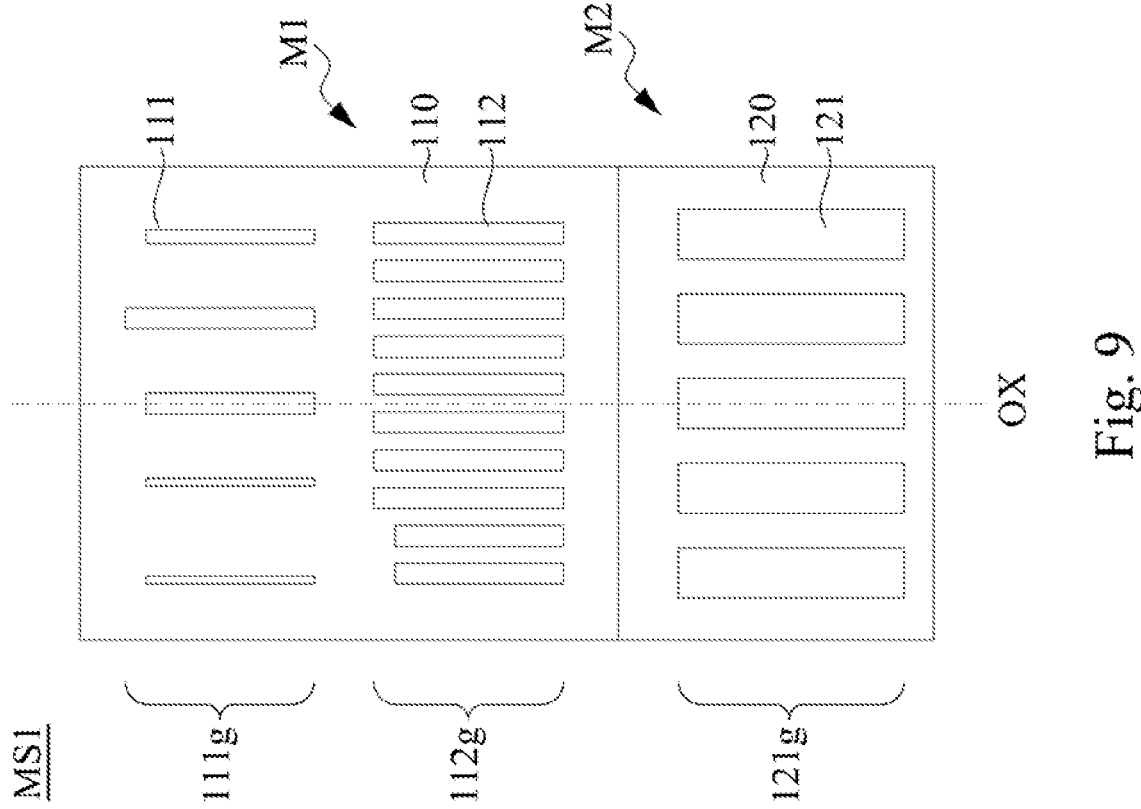
Fig. 9
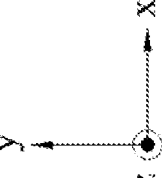

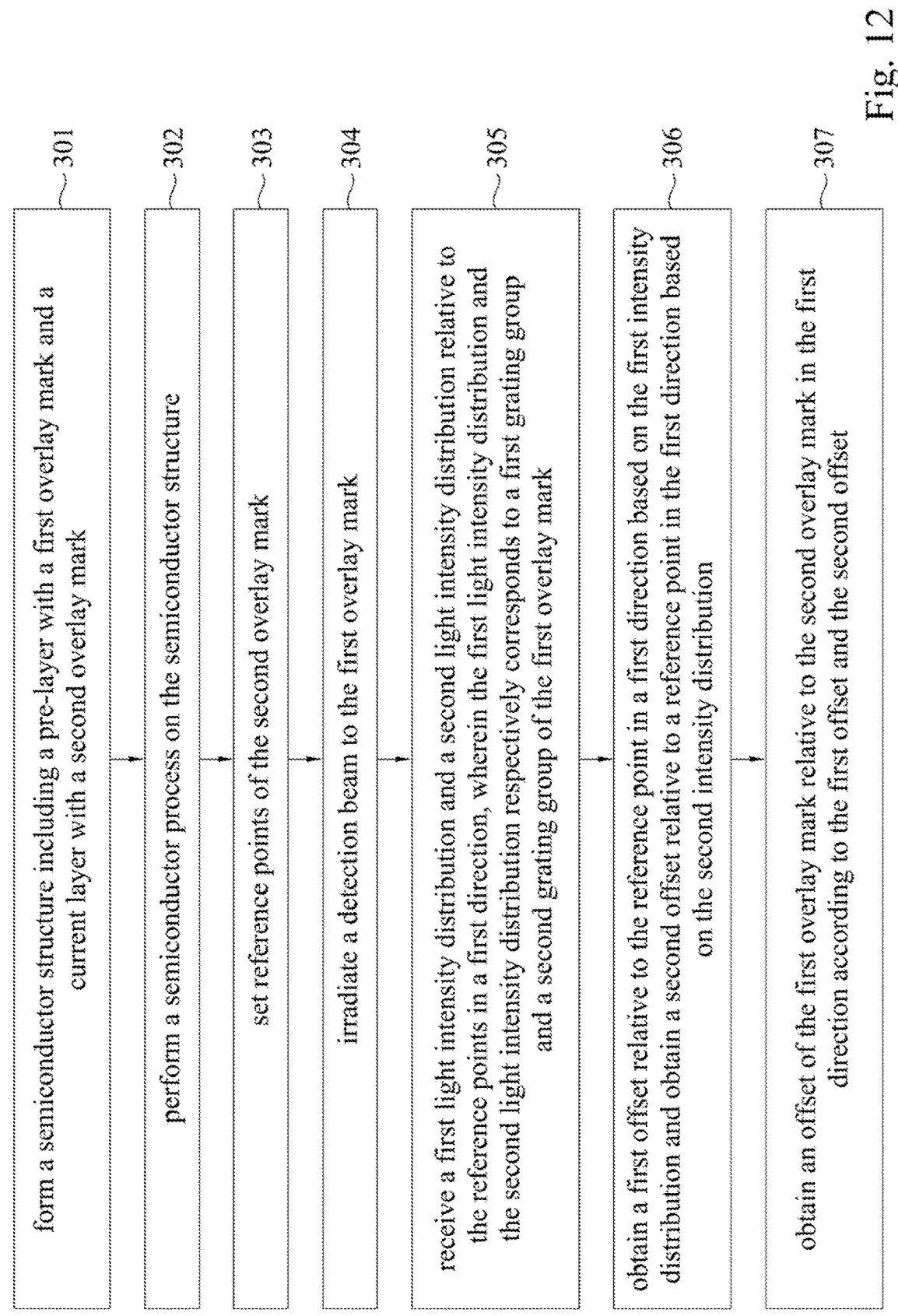

300 form a semiconductor structure including a pre-layer with a first overlay mark and a current layer with a second overlay mark ⟋301 perform a semiconductor process on the semiconductor structure ⟋302 set reference points of the second overlay mark ⟋303 irradiate a detection beam to the first overlay mark ⟋304 receive a first light intensity distribution and a second light intensity distribution relative to the reference points in a first direction, wherein the first light intensity distribution and the second light intensity distribution respectively corresponds to a first grating group and a second grating group of the first overlay mark ⟋305 obtain a first offset relative to the reference point in a first direction based on the first intensity distribution and obtain a second offset relative to a reference point in the first direction based on the second intensity distribution ⟋306 obtain an offset of the first overlay mark relative to the second overlay mark in the first direction according to the first offset and the second offset ⟋307

Fig. 12

SEMICONDUCTOR STRUCTURE AND METHOD OF OVERLAY MEASUREMENT OF SEMICONDUCTOR STRUCTURE

BACKGROUND

Field of Invention

The present disclosure relates to a semiconductor structure and a method of overlay measurement of semiconductor structure.

Description of Related Art

An important issue to confirm the overlay alignment relationship between semiconductor layers forming a structure. For example, two overlay marks can be formed on two different semiconductor layers, and an alignment between the two semiconductor layers can be confirmed through an alignment relationship of the two overlay marks. However, once any of the two overlay marks is damaged, the overlay alignment measurement for the two semiconductor layers would fail, and it is difficult to determine whether any of the two overlay marks is damaged after the semiconductor structure is formed.

SUMMARY

An aspect of the present disclosure is related to a method of overlay measurement of a semiconductor structure.

According to one or more embodiments of the present disclosure, a method of overlay measurement of a semiconductor structure includes a number of operations. A semiconductor structure with a pre-layer and a current layer over the pre-layer is provided, wherein the pre-layer includes a first overlay mark with a first grating group and a second grating group, and the current layer includes a second overlay mark. A semiconductor process is performed on the semiconductor structure. A detection beam is irradiated to the first overlay mark. A first intensity distribution of the first grating group and a second intensity distribution of the second grating group with respect to the reference point of the first overlay mark are received.

In one or more embodiments of the present disclosure, the method of overlay measurement of a semiconductor structure includes a number of operations. A first offset of the first grating group with respect to the reference point is obtained based on the first intensity distribution. A second offset of the second grating group with respect to the reference point is obtained based on the second intensity distribution. A position difference between the first overlay mark and the second overlay mark is determined based on the first offset and the second offset.

In some embodiments, obtaining the first offset includes selecting a first center region of the first intensity distribution and determining a first center point of the first center region based on an average intensity near the first center point. The first offset is a distance between the reference point and the first center point.

In some embodiments of the present disclosure, the first center point is a position corresponding to an extreme point of the first intensity distribution.

In one or more embodiments of the present disclosure, each of the first grating group and the second grating group includes a plurality of gratings extended in a first direction and arranged in a second direction perpendicular to the first direction. A number of the gratings of the first grating group is different from a number of the gratings of the second grating group.

In some embodiments, the first grating group and the second grating group are arranged in the first direction. A first density of the gratings of the first grating group is less than a second density of the gratings of the second grating group in the second direction. A first average intensity of the first intensity distribution is greater than a second average intensity of the second intensity distribution.

In one or more embodiments of the present disclosure, the first overlay mark further includes a third grating group. The method of overlay measurement of a semiconductor structure includes following operation. A third intensity distribution of the third grating group with respect to the reference point is received.

In some embodiments, each of the first grating group, the second grating group and the third grating group includes a plurality of gratings extended in a first direction and arranged in a second direction perpendicular to the first direction. A number of the gratings of the first grating group, a number of the gratings of the second grating group and a number of the gratings of the third grating group are different from each other.

In some embodiments, a first density of the gratings of the first grating group is less than a second density of the gratings of the second grating group in the second direction. The second density is less than a third density of the gratings of the third grating group. The first grating group, the second grating group and the third grating group are arranged along the first direction in order.

In one or more embodiments of the present disclosure, performing the semiconductor process on the semiconductor structure includes performing a planarization process, a polishing process or an etching process on the pre-layer or the current layer.

An aspect of the present disclosure is related to a semiconductor structure.

According to one or more embodiments of the present disclosure, a semiconductor structure includes a pre-layer and a current layer. The pre-layer includes a first overlay mark. The first overlay mark includes a first grating group and a second grating group. Each of the first grating group and the second grating group includes a plurality of gratings extended in a first direction. A first density of the gratings of the first grating group is different from a second density of the gratings of the second grating group in a second direction perpendicular to the first direction. The current layer is directly located on the pre-layer. The current layer includes a second overlay mark. The second overlay mark includes a plurality of gratings extended in the first direction.

In one or more embodiments of the present disclosure, the first overlay mark further includes a third grating group with a plurality of gratings extended in the first direction. The first density, the second density and a third density of the gratings of the third grating group in the second direction are different from each other.

In some embodiments, the first density is less than the second density. The second density is less than the third density. The first grating group, the second grating group and the third grating group are arranged along the first direction in order.

In one or more embodiments of the present disclosure, the pre-layer further includes a third overlay mark. The third overlay mark includes a third grating group and a fourth grating group. Each of the third grating group and the fourth grating group includes a plurality of gratings extended in the second direction. A third density of the gratings of the third grating group is different from a fourth density of the gratings of the fourth grating group in the first direction. The current layer further includes a fourth overlay mark. The fourth overlay mark includes a plurality of gratings extended in the second direction.

In one or more embodiments of the present disclosure, the second overlay mark is separated from the first overlay mark in a third direction perpendicular to the first direction and the second direction.

In summary, for a semiconductor structure with a pre-layer and a current layer, an overlay mark with a plurality of groups of gratings can be formed in the pre-layer to avoid overlay measurement failing caused from damages of the overlay marks in the pre-layer. The different groups of gratings can be regarded as different sub-overlay marks in the pre-layer. It can be determined whether the pre-layer and the current layer are aligned with each other by receiving a plurality of intensity distribution from the different grating groups in the pre-layer.

It is to be understood that both the foregoing general description and the following detailed description are by examples, and are intended to provide further explanation of the disclosure as claimed.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the disclosure.

FIG. 6 illustrates a schematic top view of an overlay mark stack according to one or more embodiments of the present disclosure;

FIG. 9 illustrates a schematic top view of an overlay mark stack according to one or more embodiments of the present disclosure;

FIG. 12 illustrates a schematic flow chart of a method of overlay measurement of semiconductor structure;

DETAILED DESCRIPTION

Figure 1:
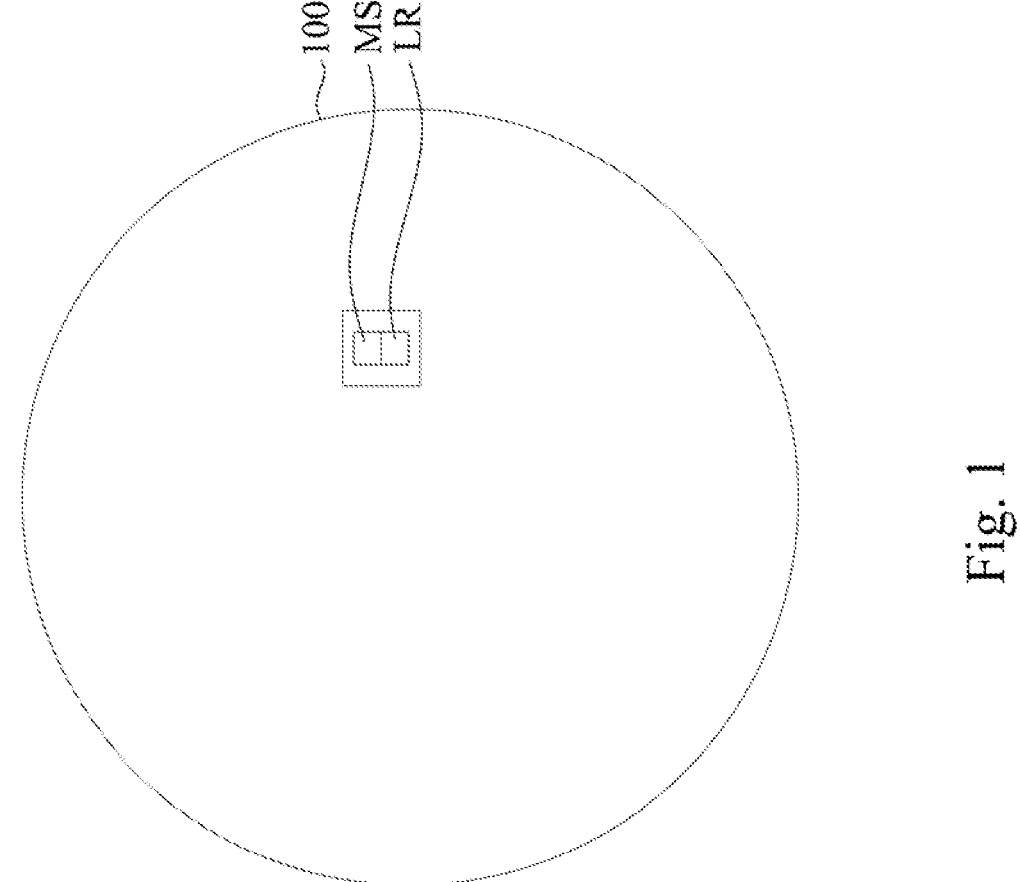
FIG. 1 illustrates a schematic top view of a semiconductor structure according to one or more embodiments of the present disclosure.

Reference will now be made in detail to the embodiments of the present disclosure, examples of which are illustrated in the accompanying drawings. Wherever possible, the same reference numbers are used in the drawings and the description to refer to the same or like parts.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases "first," "second," etc., are solely used to separate the descriptions of elements or operations with same technical terms, not intended to be the meaning of order or to limit the disclosure.

Secondly, phrases "comprising," "includes," "provided," and the like, used in the context are all open-ended terms, i.e. including but not limited to.

Further, in the context, "a" and "the" can be generally referred to one or more unless the context particularly requires. It will be further understood that phrases "comprising," "includes," "provided," and the like, used in the context indicate the characterization, region, integer, step, operation, element and/or component it stated, but not exclude descriptions it stated or additional one or more other characterizations, regions, integers, steps, operations, elements, components and/or groups thereof.

Figure 2:
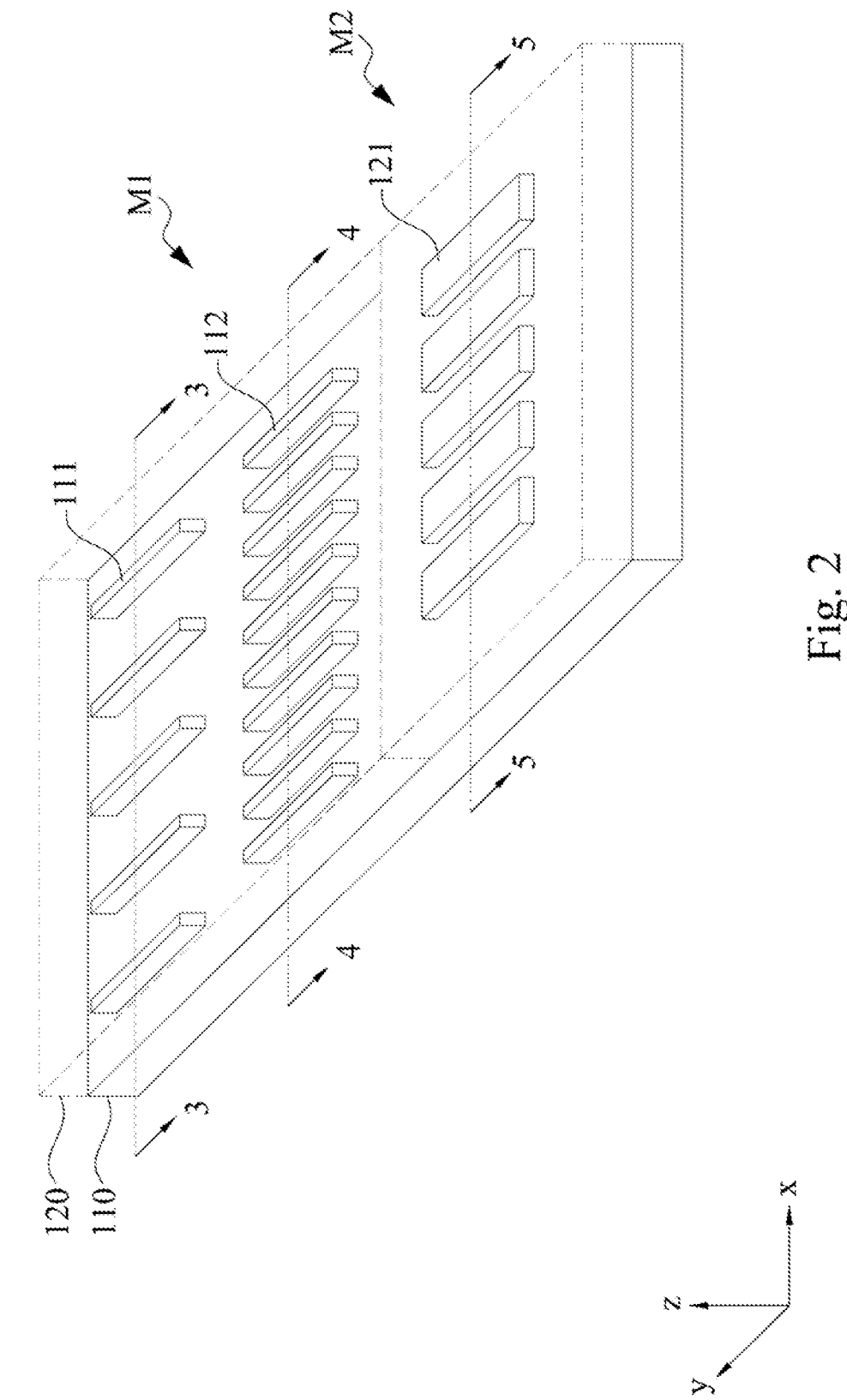
FIG. 2 illustrates a schematic perspective view of an overlay mark stack according to one or more embodiments of the present disclosure.

Reference is made to FIGS. 1 and 2. FIG. 1 illustrates a schematic top view of a semiconductor structure 100 according to one or more embodiments of the present disclosure, wherein the semiconductor structure 100 includes an overlay mark stack MS in a local region LR. FIG. 2 illustrates a schematic perspective view of an overlay mark stack MS1 according to one or more embodiments of the present disclosure, wherein the overlay mark stack MS1 is an example of the overlay mark in an embodiment of the present disclosure.

As shown in FIG. 1, in this embodiment, a semiconductor structure 100 is formed on a semiconductor wafer. In this embodiment, the overlay mark stack MS is formed a local region LR of the semiconductor structure 100. FIG. 2 schematically illustrates the local region LR of the semiconductor structure 100, and the overlay mark stack MS of FIG. 1 corresponds to an overlay mark stack MS as shown in FIG. 2. Other integrated circuits, elements or conductive structure can be formed in other region out of the local region LR in which the overlay mark stack MS is located.

As shown in FIG. 2, the semiconductor structure 100 includes a pre-layer 110 and a current layer 120. In one or more embodiments of the present disclosure, the current layer 120 is directed located on the pre-layer 110.

In one or more embodiments, the pre-layer 110 and the current layer 120 can be stacked semiconductor layers formed on a wafer. For example but not limited to the present disclosure, the pre-layer 110 and the current layer 120 can include dielectric layer, intermediate layer or resist layer.

In this embodiment, the pre-layer 110 includes an overlay mark M1. As shown in FIG. 2, in this embodiment, the overlay mark M1 includes a plurality of gratings 111 and gratings 112. The gratings 111 and the gratings 112 extend in a direction y. The gratings 111 are arranged in a direction x to form a grating group 111g as shown in following FIG. 3. The gratings 112 are arranged in the direction x to formed another grating group 112g as shown in following FIG. 4.

As shown in FIG. 2, in this embodiment, a number of the gratings 111 is less than a number of the gratings 112. In other words, a density of the gratings 111 in the direction x is less than a density of the gratings 112 in the direction x, wherein the densities of the gratings 111 and the gratings 112 can be respectively regarded as the numbers of the gratings 111 and the gratings 112 for an unit length in the direction x.

In this embodiment, the current layer 120 includes an overlay mark M2. As shown in FIG. 2, the overlay mark M2 is separated from the overlay mark M1 is direction z perpendicular to the direction x and the direction y. The overlay mark M2 includes a plurality of gratings 121 extended in the direction y and arranged in direction x.

Figure 3:
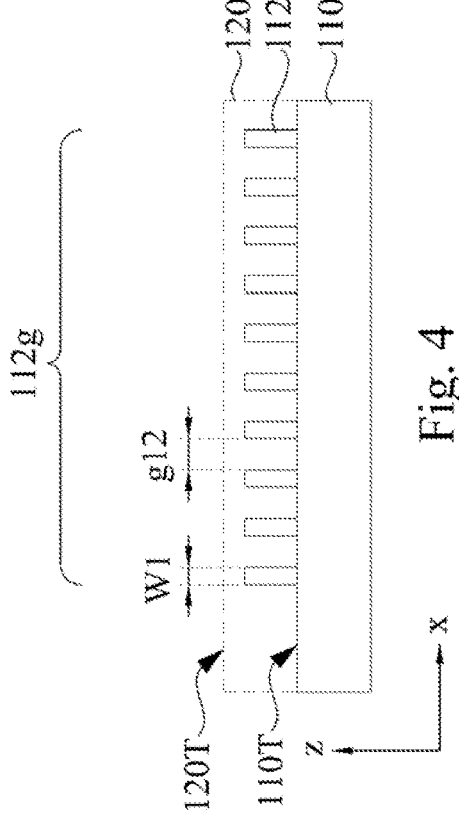
FIGS. 3-5 illustrate cross-section views of FIG. 2 along different lines.
Figure 4:
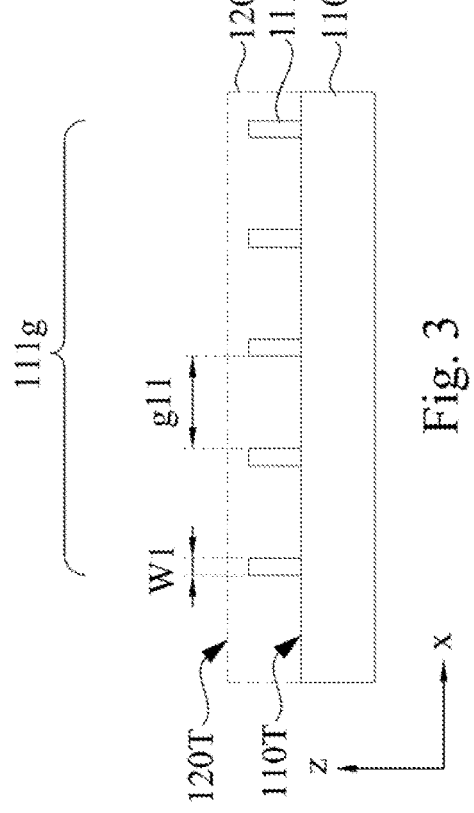
Figure 5:
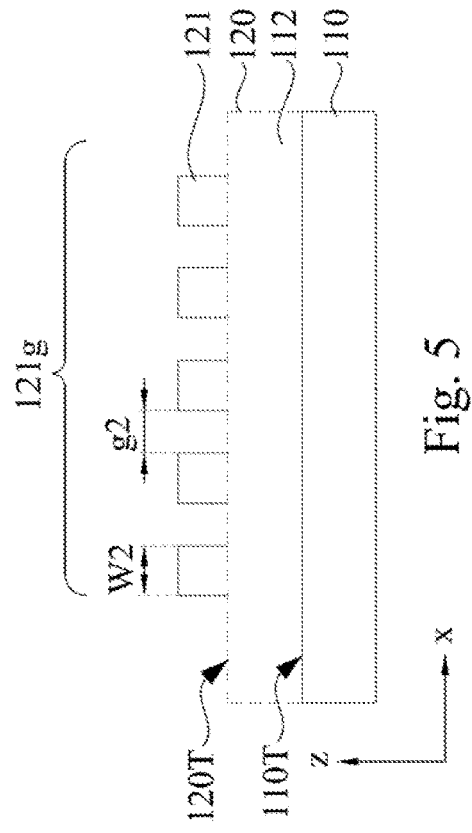

Reference is made to FIGS. 3-5 to further illustrate the overlay mark M1 in pre-layer 110 and the overlay mark M2 in the current layer 120. FIGS. 3-5 illustrate cross-section views of FIG. 2 along different lines.

Reference is made to FIG. 2 and FIG. 3. In this embodiment, the gratings 111 are located on a top surface 110T of the pre-layer 110 and form a grating group 111g. As shown in FIG. 3, each of the gratings 111 has the same width W1. The gratings 111 are arranged on the direction x and separated from each other by a gap g11. In this embodiment, the gratings 111 are spaced equally.

Reference is made to FIG. 2 and FIG. 4. In this embodiment, the gratings 112 are located on a top surface 110T of the pre-layer and form a grating group 112g. As shown in FIG. 4, each of the gratings 112 has the same width W1. The gratings 112 are arranged on the direction x and separated from each other by a gap g12. In this embodiment, the gratings 112 are spaced equally.

As shown in FIG. 3 and FIG. 4, in this embodiment, arrangement lengths in which the gratings 111 and the gratings 112 are arranged in are the same in the direction x. In addition, in FIG. 3 and FIG. 4, the gratings 111 and the gratings 112 have the same width W1, and a number of the gratings 111 of the grating group 111g is less than a number of the gratings 112 of the grating group 112g.

In this embodiment, the number of the gratings 112 of the grating group 112g is twice as much as the number of the gratings 111 of the grating group 111g, and the gap g11 is twice as much as the gap g12. In other words, the density of the gratings 112 of the grating group 112g is twice as much as the density of the gratings 111 of the grating group 111g. The grating group 111g and the grating group 112g with different density of gratings can induce different intensity distribution.

Reference is made to FIG. 2 and FIG. 5. In this embodiment, the gratings 121 are located on a top surface 120T of the current layer and form a grating group 121g. As shown in FIG. 5, each of the gratings 121 has the same width W2 in the direction x. In this embodiment, the width W2 is greater than the width W1. The gratings 121 are arranged on the direction x and separated from each other by a gap g2. In this embodiment, the gratings 121 are also spaced equally.

In one or more embodiments of the present disclosure, the grating group 111g, the grating group 112g and the grating group 121g can be used to generate diffraction intensity distribution. For example, a detection beam can be emitted to the overlay mark stack MS1 with the overlay mark M1 and/or the overlay mark M2. The grating group 111g and the grating group 112g of the overlay mark M1 can diffract the detection beam to generate two different diffraction intensity distributions in direction x. In some embodiment, the grating group 121g of overlay mark M2 can diffract the detection beam to generate diffraction intensity distribution in direction x, and a reference point/reference line can be determined based on the diffraction intensity distribution generated by the grating group 121g. By comparing the reference point/reference line of the grating group 121g with the two diffraction intensity distributions of the grating group 111g and the grating group 112g, an overlay alignment measurement of the overlay mark M1 and the overlay mark M2 can be performed and a position difference between the overlay mark M1 and the overlay mark M2 can be obtained. In details, please refer to the following discussion.

FIG. 6 illustrates a schematic top view of an overlay mark stack MS1 according to one or more embodiments of the present disclosure, wherein the overlay mark stack MS1 shows that the overlay mark M1 in the pre-layer 110 and the overlay mark M2 in the current layer 120 located over the pre-layer. It should be noted that the overlay mark M1 and the overlay mark M2 are at different heights in the direction z.

As shown in FIG. 6, the overlay mark M1 includes two grating groups including the grating group 111g and the grating group 112g, wherein the density of gratings 112 of the grating group 112g is twice much as the density of gratings 111 of the grating group 111g. In other words, the grating groups 111g and 112g can be regarded as two sub-overlay mark of the overlay mark M1. The grating group 111g can be regarded as a pre-iso overlay mark in the pre-layer 110. The grating group 112g can be regarded as a pre-dense mark in the pre-layer 110. For the grating group 111g and the grating group 112g, two independent overlay alignment relations with respect to the overlay mark M2 can be provided.

As shown in FIG. 6, a reference line OX is provided. The reference line OX is provided based on the overlay mark M2 in the current layer 120. Since the current layer 120 is formed on the pre-layer 110, the reference line OX can be determined by capturing the image of the overlay mark M2 or receiving a corresponding light intensity distribution signal diffracted from the overlay mark M2.

Figures 7, 8:
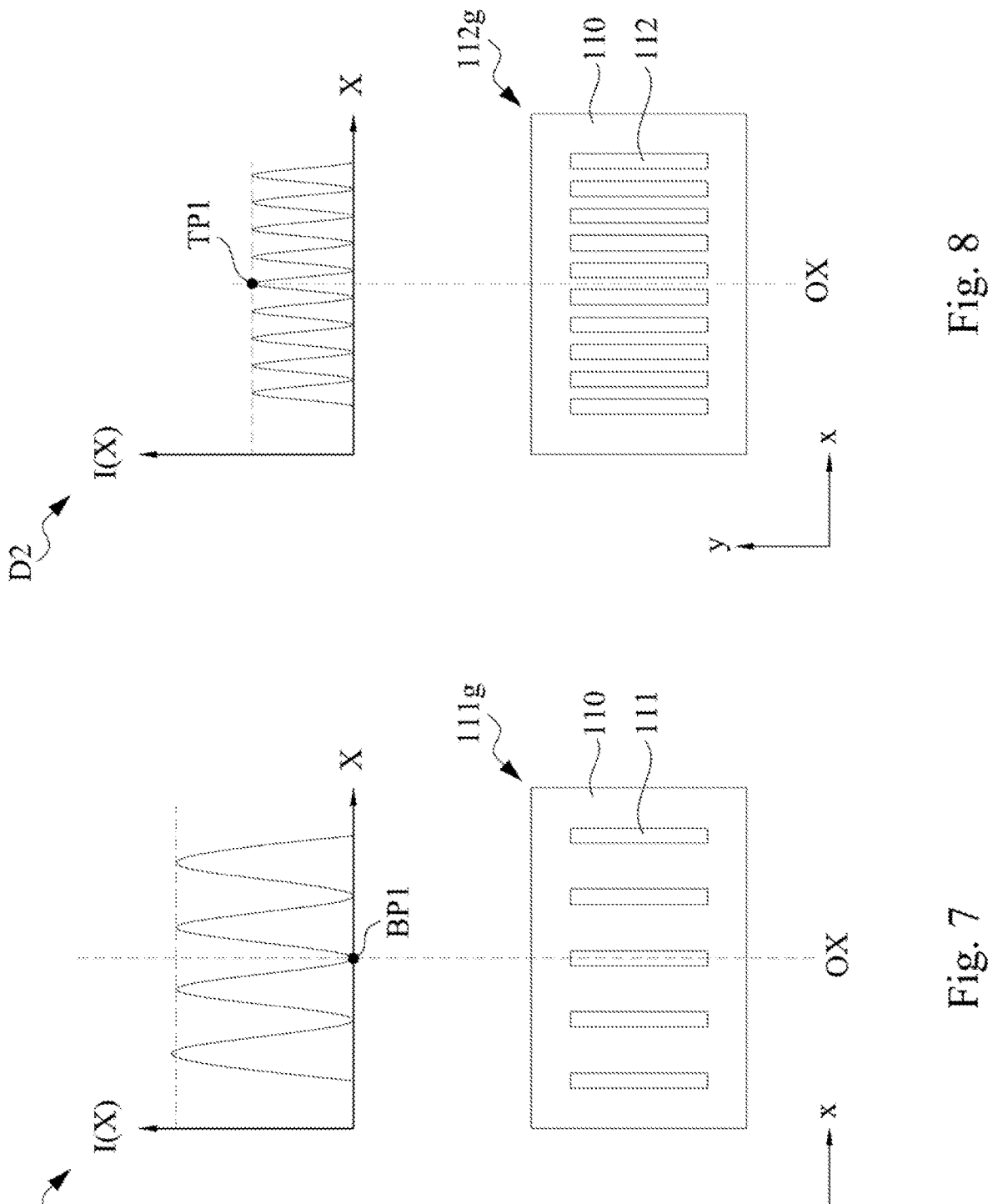
FIGS. 7 and 8 illustrate different grating groups in FIG. 6 with corresponding intensity distribution.

FIG. 6 illustrates a standard overlay stack situation for the overlay mark M1 and the overlay mark M2. Reference is made to FIGS. 7 and 8 to illustrate the overlay alignment measurement between the overlay marks M1 and M2. FIGS. 7 and 8 illustrate different grating groups in FIG. 6 with corresponding intensity distribution.

FIG. 7 illustrates the grating group 111g and a corresponding intensity distribution D1. In one or more embodiments, after the current layer 120 and the overlay mark M2 are formed, a detection beam can be irradiated to the overlay mark M1. Then, the gratings 111 of the grating group 111g can diffract the detection beam to generate diffraction light signal. The diffraction light signal generated by the grating group 111g are received by a light sensor (not shown in figures) to provide the intensity distribution D1. The horizontal axis of the intensity distribution D1 corresponds to position X along the direction x. The vertical axis of the intensity distribution D1 corresponds to the diffraction light intensity I(X) with respect to the position X.

In FIG. 7, the intensity distribution D1 is a wave, wherein peaks of the intensity I(X) correspond to positions in the gaps between the gratings 111 of the grating group 111g, and the intensity I(X) reduce in the positions corresponds to the grating 111. The reference line OX corresponds to a bottom point BP1 of the intensity I(X) in the intensity distribution D1, wherein the bottom point BP1 is an extreme point of the intensity I(X) in the intensity distribution D1.

Similarly, FIG. 8 illustrates the grating group 112g and a corresponding intensity distribution D2. In one or more embodiments, after the current layer 120 and the overlay mark M2 are formed, a detection beam can be irradiated to the overlay mark M1, and the gratings 112 of the grating group 112g can diffract the detection beam to generate diffraction light signal. The diffraction light signal generated by the grating group 112g are received by a light sensor to provide the intensity distribution D2. The horizontal axis of the intensity distribution D2 corresponds to position X along the direction x. The vertical axis of the intensity distribution D2 corresponds to the diffraction light intensity I(X) with respect to the position X.

In FIG. 8, the intensity distribution D2 is also a wave, wherein peaks of the intensity I(X) correspond to positions in the gaps between the gratings 112 of the grating group 112g, and the intensity I(X) reduce in the positions corresponds to the grating 112. The reference line OX corresponds to a top point TP1 of the intensity I(X) in the intensity distribution D2, wherein a top point TP1 is an extreme point of the intensity I(X) in the intensity distribution D1.

It should be noted that the reference line OX is determined by a reference point of the overlay mark M2.

Reference is made to FIG. 7 and FIG. 8. An average intensity of the intensity I(X) in intensity distribution D1 is greater than an average intensity of the intensity I(X) in intensity distribution D2. The average intensities of the intensity distribution D1 and the intensity distribution D2 are illustrated as horizontal dash lines in FIG. 7 and FIG. 8. That is, the greater density of the gratings in the grating group, the less average intensity. By focusing the average intensity, it can easily identify the intensity distribution D1 generated by the grating group 111g and the intensity distribution D2 generated by the grating group 112g.

Reference is made to FIG. 9. FIG. 9 illustrates a schematic top view of an overlay mark stack MS1 according to one or more embodiments of the present disclosure. In FIG. 9, a further semiconductor process is performed on the semiconductor structure 100, and the overlay mark M1 are damaged during the semiconductor process.

As shown in FIG. 9, the gratings 111 of the grating group 111g are damaged. Some of the gratings 111 are shortened, and some of the gratings 111 are further thing. It can be shown that the gratings 111 near the edge of the grating group 111g are damaged most seriously. Similarly, some of the gratings 112 of the grating groups 112g are damaged. However, few of the gratings 112 in the left edge of the grating group 112g are damaged to be shortened.

In some embodiments, the semiconductor process performed on the pre-layer 110 or the current layer 120 of the semiconductor structure 100 can be a planarization process, a polishing process or an etching process on the pre-layer 110 or the current layer 120. In some embodiments, the semiconductor process can be performed during the semiconductor structure 100 is formed. For example, a chemical mechanical planarization/polishing process can be performed on the current layer 120.

It should be noted that it is difficult to directly determine whether the overlay mark M1 is damaged since the current layer 120 is directly located on the overlay mark M1. However, once the gratings 111 of the grating group 111g or the gratings 112 of the grating group 112g are damaged, the intensity distributions corresponds to the grating groups 111g and 112g are able to present the damages of the gratings 111 and 112.

Figures 10, 11:
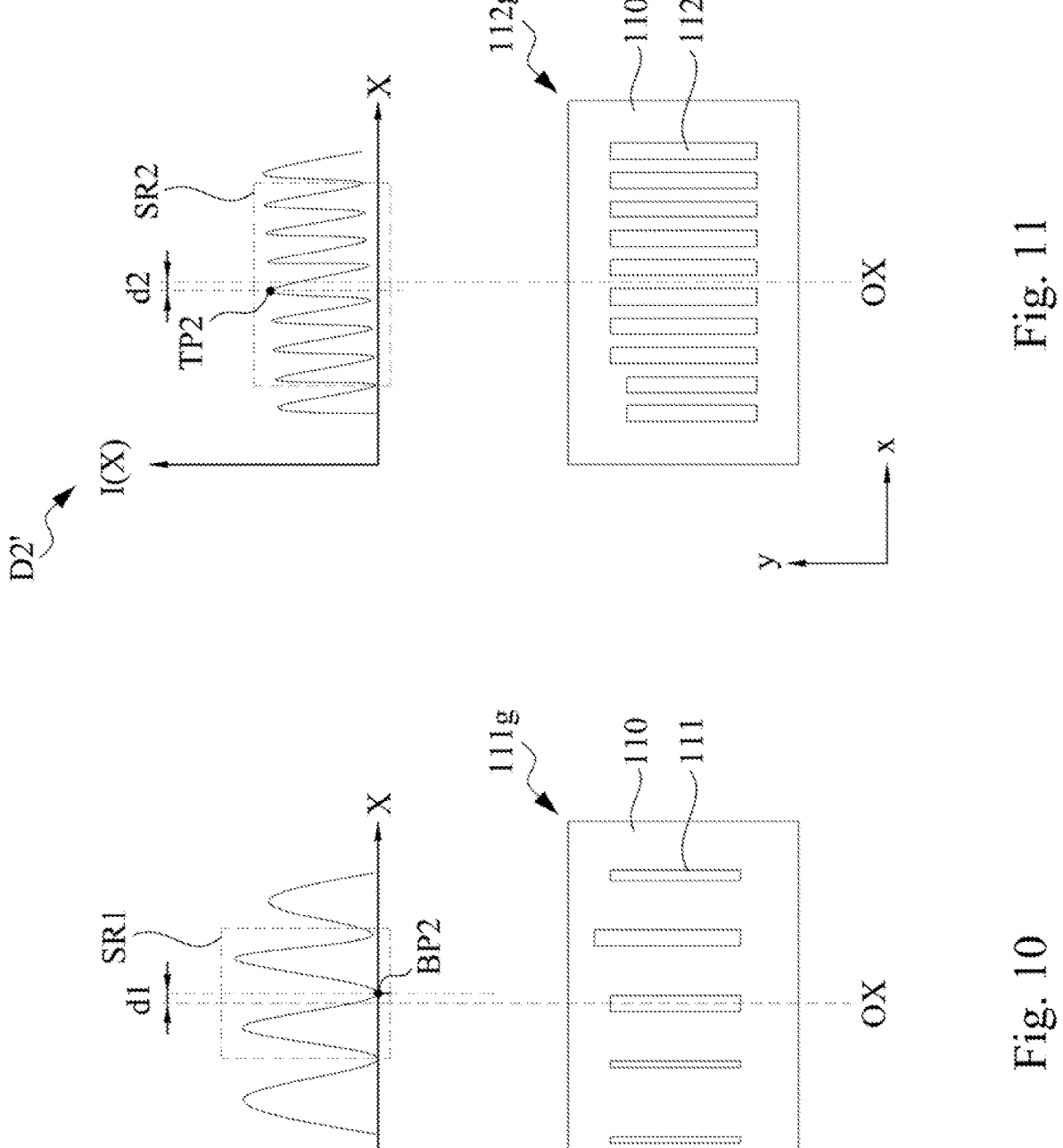
FIGS. 10 and 11 illustrate different grating groups in FIG. 9 with corresponding intensity distribution.

FIGS. 10 and 11 illustrate the grating group 111g and the grating group 112g in FIG. 9 with corresponding intensity distribution, respectively.

Reference is made to FIG. 9 and FIG. 10. The intensity distribution D1' shows the influence to the diffraction light generated by the grating group 111g with damaged gratings 111. Since the grating 111 at two of the edge of the grating group 111g are shortened, the intensity I(X) at the positions corresponding to the edge of the grating group 111g is reduced.

As shown in FIG. 10, the reference line OX can be provided based on the overlay mark M2.

A select region SR1 is a region selected near the reference line OX and includes a wave near a center extreme point. A center bottom point BP2 can be an extreme point of the intensity I(X) in the intensity distribution D1' immediately-adjacent the reference line OX. In FIG. 10, by selecting a select region SR1 in the intensity I(X) of the intensity distribution D1', a bottom point BP2 of the intensity I(X) is determined. In another point of view, the select region SR1 is determined based on an average intensity near the bottom point BP2. By selecting the select region SR1, the peaks of the intensity I(X) in the select region SR1 have similar amplitudes, and the reduced intensity corresponding to the damaged gratings 111 can be ignored. An offset d1 is provided based on a position different between the reference line OX and the bottom point BP2.

Reference is made to FIG. 9 and FIG. 11. The intensity distribution D2' shows the influence to the diffraction light generated by the grating group 112g with damaged gratings 112. Since the grating 112 at the left edge of the grating group 112g are shortened, the intensity I(X) at the positions corresponding to the left edge of the grating group 112g is reduced.

As shown in FIG. 10, the reference line OX can be provided based on the overlay mark M2. A bottom point TP2 is an extreme point of the intensity I(X) immediately-adjacent the reference line OX. A select region SR2 is a region selected near the reference line OX and the bottom point TP2 based on an average intensity near the center bottom point TP2. The intensity I(X) is a wave in the select region SR2. By selecting a select region SR2 in the intensity I(X) of intensity distribution D2', an offset d2 is provided based on a position different between the reference line OX and the bottom point TP2 at the center of the select region SR2. The bottom point TP2 is an extreme point of the intensity I(X) in the select region SR2 of the intensity distribution D2'.

Based on the offset d1 provided by the intensity distribution D1' and the offset d2 provided by the intensity distribution D2', the overlay alignment of the overlay mark M1 and the overlay mark M2 in the direction x can be determined. In some embodiments, an overlay shift between overlay mark M1 and the overlay mark M2 can be defined by a combination of the offset d1 and the offset d2, wherein the offset d1 and the offset d2 are respectively obtained by the select region SR1 of the intensity distribution D1' and the select region SR2 of the intensity distribution D2'.

Reference is made to FIG. 12 to summarize an overall overlay alignment measurement by using the overlay mark M2 with two grating groups 111g and 112g, which can be regarded as separated pre-iso mark and pre-dense mark of the overlay mark M1 in the pre-layer 110.

FIG. 12 illustrates a schematic flow chart of a method 300 of overlay measurement of semiconductor structure.

Reference is made to FIGS. 1 and 2. In operation 301, a semiconductor structure 100 including a pre-layer 110 with a first overlay mark M1 and a current layer 120 with a second overlay mark M2 is formed. The first overlay mark M1 and the second overlay mark M2 form an overlay mark stack MS1 shown in FIG. 6.

In operation 302, a semiconductor process is performed on the semiconductor structure 100. In some embodiments, the semiconductor process performed on the pre-layer 110 or the current layer 120 of the semiconductor structure 100 can be a planarization process, a polishing process or an etching process on the pre-layer or the current layer. As shown in FIG. 9, some of the gratings 111 and 112 of the overlay mark M1 are damaged.

In some embodiments, the operation 302 can be performed during the operation 301. For example, a semiconductor process can be performed on the pre-layer 110 before the current layer 120 is formed on the pre-layer 110.

In operation 303, a reference point of the second overlay mark M2 is set. As shown in FIGS. 10 and 11, the reference line OX corresponding to the reference point of the second overlay mark M2 is provided.

In operation 304, a detection beam is irradiated to the first overlay mark M1. Then, as shown in FIGS. 10 and 11, in operation 305, receive a first light intensity distribution D1' and a second light intensity distribution D2' relative to the reference point in a first direction x, wherein the first light intensity distribution D1' and the second light intensity distribution D2' respectively corresponds to a first grating group 111g with damaged gratings 111 and a second grating group 112g with damaged gratings 112 of the first overlay mark M1.

In some embodiment, the operation 303 and the operation 304 can be performed in the same time. For example, a diffraction intensity distribution of the overlay mark M2 can be obtained after the detection beam is irradiated to the overlay mark stack MS1. Then, the reference point, which corresponds to a position of the reference line OX in direction x, can be obtained by the diffraction intensity distribution of the overlay mark M2.

As shown in FIGS. 10 and 11, in operation 306, a first offset d1 relative to the reference point in the first direction x based on the first intensity distribution D1', and a second offset d2 relative to the reference point in the first direction x based on the second intensity distribution D2'. In FIG. 10, the offset d1 is a distance between the reference line OX and the bottom point BP2, which is an extreme point in the select region SR1 of the first intensity distribution D1'. In FIG. 11, the offset d2 is a distance between the reference line OX and the top point TP2, which is an extreme point in the select region SR2 the second intensity distribution D2'.

Following operation 306, in operation 307, an offset of the first overlay mark M1 relative to the second overlay mark M2 in the first direction x according to the first offset d1 and the second offset d2. The offset is a position difference between the first overlay mark M1 and the second overlay mark M2 in the first direction x. For example but not limited to the present disclosure, in operation 307, an offset of the first overlay mark M1 relative to the second overlay mark M2 can be a first weight value times the first offset d1 plus a second weight value times the second offset d2.

Figure 13:
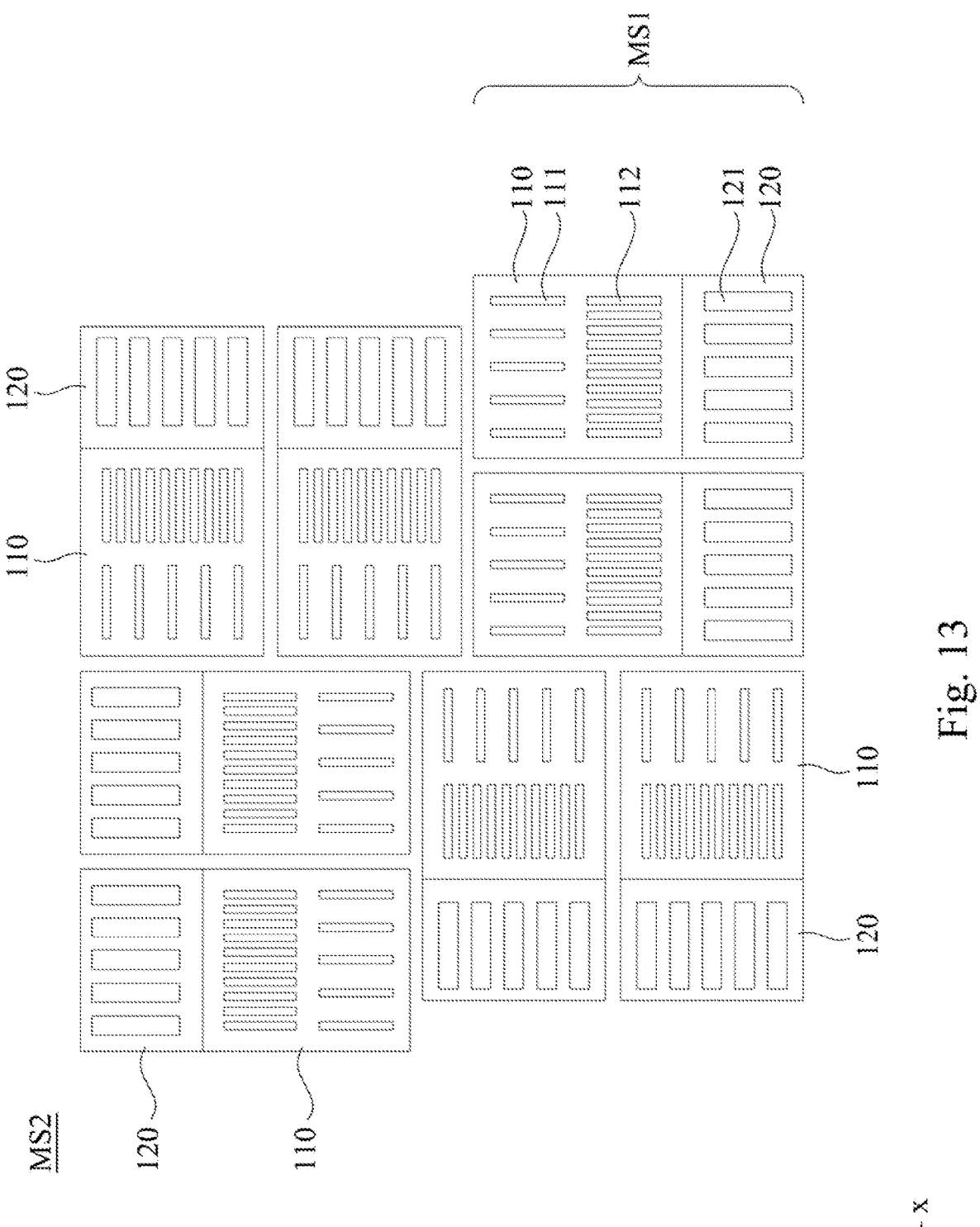
FIG. 13 illustrates a schematic top view of an overlay mark stack according to one or more embodiments of the present disclosure.

FIG. 13 illustrates a schematic top view of an overlay mark stack MS2 according to one or more embodiments of the present disclosure. The difference between the overlay mark stack MS1 in FIG. 6 and the overlay mark stack MS3 in FIG. 13 is that the overlay mark stack MS2 further includes addition sets of overlay mark stack, which includes two sets of the overlay mark stack MS1 as shown in FIG. 6. In FIG. 13, some of the overlay mark stack MS2 includes gratings extended along the direction x and arranged in the direction y. That is, additional overlay marks in the pre-layer 110 and additional overlay marks the current layer 120 are provided and have a plurality of gratings extended in the direction x and arranged in the direction y. A position difference between the pre-layer 110 and the current layer 120 in direction y can be determined through operations similar to the method 300.

Figure 14:
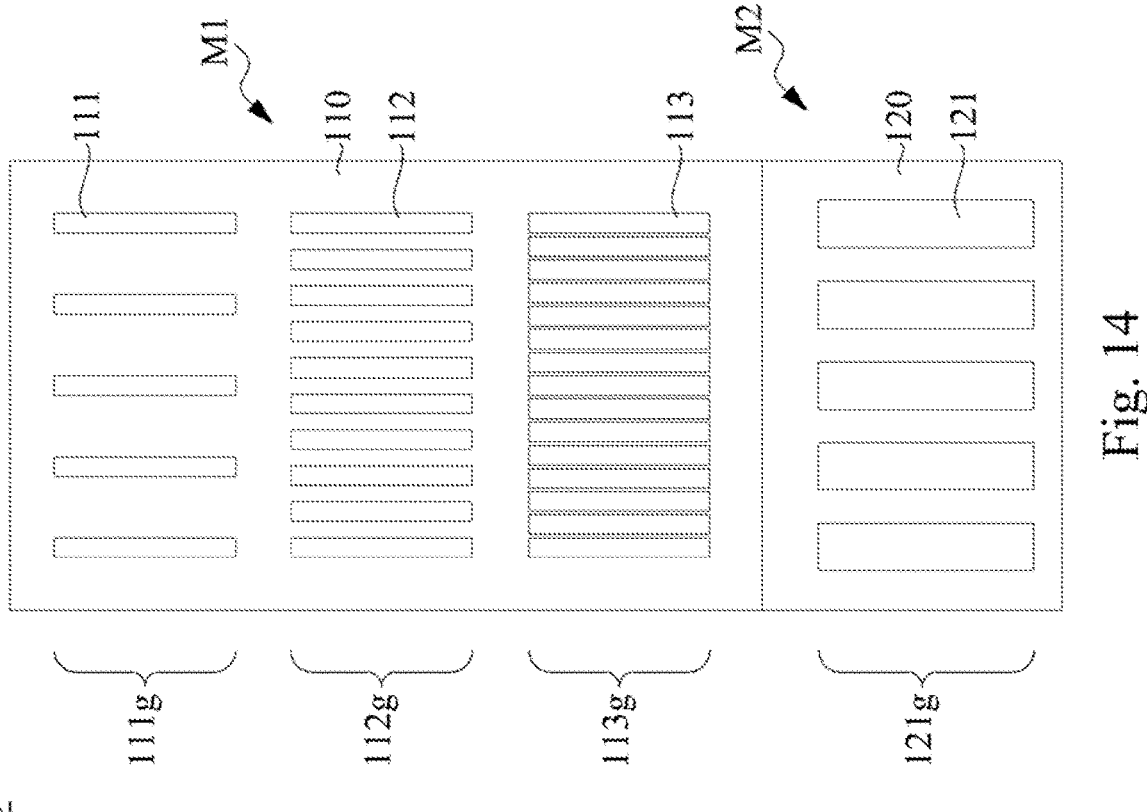
FIG. 14 illustrates a schematic top view of an overlay mark stack according to one or more embodiments of the present disclosure.

FIG. 14 illustrates a schematic top view of an overlay mark stack MS3 according to one or more embodiments of the present disclosure. The difference between the overlay mark stack MS1 in FIG. 6 and the overlay mark stack MS3 in FIG. 14 is that the overlay mark M1 further includes a grating group 113g. The grating group 113g includes a plurality of gratings 113 extended in the direction y and arranged in the direction x. Therefore, by irradiating a detection beam to the overlay mark M1 in the overlay mark stack MS3, three different intensity distribution can be obtained.

It should be noted that the greater density of the gratings in the grating group, the less average intensity. As shown in FIG. 13, the density of the gratings 113 of the grating group 113g is greater than the density of gratings 111 of grating group 111g or the density of gratings 112 of grating group 112g. It can easily identify the intensity distributions generated by the grating groups 111g, 112g and 113g to obtain offsets with respect to a reference line of the overlay mark M2. Then, a position difference can be obtained by a combination of the offsets from the intensity distributions generated by the grating groups 111g, 112g and 113g.

In this embodiment, as shown in FIG. 14, the grating groups 111g, 112g and 113g are arranged along direction y in order, so it can further easily identify the intensity distributions generated by the grating groups 111g, 112g and 113g.

In summary, for a semiconductor structure with a pre-layer and a current layer, an overlay mark with a plurality of groups of gratings can be formed in the pre-layer to avoid overlay measurement failing caused from damages of the overlay marks in the pre-layer. The different groups of gratings can be regarded as different sub-overlay marks in the pre-layer. It can be determined whether the pre-layer and the current layer are aligned with each other by receiving a plurality of intensity distribution from the different groups of gratings in the pre-layer.

Although the embodiments of the present disclosure have been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the embodiments of the present disclosure without departing from the scope or spirit of the present disclosure. In view of the foregoing, it is intended that the present disclosure cover modifications and variations of this disclosure provided they fall within the scope of the following claims.

What is claimed is:

1. A method of overlay measurement of a semiconductor structure, comprising:

providing a semiconductor structure with a pre-layer and a current layer over the pre-layer, wherein the pre-layer comprises a first overlay mark with a first grating group and a second grating group, and the current layer comprises a second overlay mark;

performing a semiconductor process on the semiconductor structure;

setting a reference point of the second overlay mark after the semiconductor process is performed;

irradiating a detection beam to the first overlay mark;

receiving a first intensity distribution of the first grating group and a second intensity distribution of the second grating group with respect to the reference point of the first overlay mark;

obtaining a first offset of the first grating group with respect to the reference point based on the first intensity distribution;

obtaining a second offset of the second grating group with respect to the reference point based on the second intensity distribution; and determining a position difference between the first overlay mark and the second overlay mark based on the first offset and the second offset.

2. The method of claim 1, wherein obtaining the first offset comprises selecting a first center region of the first intensity distribution and determining a first center point of the first center region based on an average intensity near the first center point, and the first offset is a distance between the reference point and the first center point.

3. The method of claim 2, wherein the first center point is a position corresponding to an extreme point of the first intensity distribution.

4. The method of claim 1, wherein each of the first grating group and the second grating group comprises a plurality of gratings extended in a first direction and arranged in a second direction perpendicular to the first direction, and a number of the gratings of the first grating group is different from a number of the gratings of the second grating group.

5. The method of claim 4, wherein the first grating group and the second grating group are arranged in the first direction, a first density of the gratings of the first grating group is less than a second density of the gratings of the second grating group in the second direction, and a first average intensity of the first intensity distribution is greater than a second average intensity of the second intensity distribution.

6. The method of claim 1, wherein the first overlay mark further comprises a third grating group, the method further comprises:

receiving a third intensity distribution of the third grating group with respect to the reference point.

7. The method of claim 6, wherein each of the first grating group, the second grating group and the third grating group comprises a plurality of gratings extended in a first direction and arranged in a second direction perpendicular to the first direction, and a number of the gratings of the first grating group, a number of the gratings of the second grating group and a number of the gratings of the third grating group are different from each other.

8. The method of claim 7, wherein a first density of the gratings of the first grating group is less than a second density of the gratings of the second grating group in the second direction, the second density is less than a third density of the gratings of the third grating group, and the first grating group, the second grating group and the third grating group are arranged along the first direction in order.

9. The method of claim 1, wherein performing the semiconductor process on the semiconductor structure comprises performing a planarization process, a polishing process or an etching process on the pre-layer or the current layer.

* * * * *